(12) United States Patent
Bhatia et al.

(10) Patent No.: US 10,270,466 B2
(45) Date of Patent: Apr. 23, 2019

(54) LDPC PERFORMANCE IMPROVEMENT USING SBE-LBD DECODING METHOD AND LBD COLLISION REDUCTION

(71) Applicant: Hughes Network Systems, LLC, Germantown, MD (US)

(72) Inventors: Gaurav Bhatia, Ellicott City, MD (US); Qiujun Huang, Potomac, MD (US); Mustafa Eroz, Rockville, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 30 days.

(21) Appl. No.: 15/237,341

(22) Filed: Aug. 15, 2016

(65) Prior Publication Data
US 2018/0048328 A1 Feb. 15, 2018

(51) Int. Cl.
*H03M 13/00* (2006.01)
*H03M 13/11* (2006.01)
*H04L 1/00* (2006.01)

(52) U.S. Cl.
CPC ...... *H03M 13/1105* (2013.01); *H03M 13/114* (2013.01); *H03M 13/1111* (2013.01);
(Continued)

(58) Field of Classification Search
CPC . H03M 13/1105; H04L 1/0045; H04L 1/0058
See application file for complete search history.

(56) References Cited

U.S. PATENT DOCUMENTS

| 7,668,248 B2 * | 2/2010 | Hocevar | H03M 13/1185 375/260 |
| 8,219,876 B2 * | 7/2012 | Radosavljevic | H03M 13/1137 714/758 |

(Continued)

FOREIGN PATENT DOCUMENTS

| EP | 2194647 | 6/2010 |
| EP | 2892157 | 7/2015 |

OTHER PUBLICATIONS

International Search Report and Written Opinion for PCTIB201754888, dated Dec. 21, 2017, 8pages.

*Primary Examiner* — Esaw T Abraham
(74) *Attorney, Agent, or Firm* — Sheppard Mullin Richter & Hampton LLP

(57) ABSTRACT

Systems and methods are described for performing Layered Belief LDPC decoding on received Standard Belief LDPC encoded data bursts. In on implementation, a receiver: demodulates a signal, the demodulated signal including a noise corrupted signal derived from a codeword encoded using standard belief LDPC encoding; converts the noise corrupted signal derived from the standard belief LDPC encoded codeword to a noise corrupted signal derived from a layered belief LDPC encoded codeword; and decodes the noise corrupted signal derived from the layered belief LDPC encoded codeword using a layered belief LDPC decoder. In further implementations, systems are described for reducing collisions in Layered Belief LDPC decoders that occur when multiple parity checks need the same soft decision at the same time. In these implementations, elements in an original LBD decoder table are rearranged to increase the distance between elements specifying the same location in a RAM where soft decisions are stored.

12 Claims, 13 Drawing Sheets

(52) U.S. Cl.
CPC ...... *H03M 13/6566* (2013.01); *H04L 1/0045* (2013.01); *H04L 1/0058* (2013.01)

(56) References Cited

U.S. PATENT DOCUMENTS

| | | | | |
|---|---|---|---|---|
| 8,225,173 | B2 * | 7/2012 | Shasha | H03M 13/033 714/746 |
| 8,286,048 | B1 | 10/2012 | Chen | |
| 8,327,219 | B2 * | 12/2012 | Kim | H03M 13/2972 375/340 |
| 8,489,957 | B2 * | 7/2013 | Wesel | H03M 13/1111 714/752 |
| 8,775,915 | B2 * | 7/2014 | Adas | H03M 13/1111 714/800 |
| 8,869,003 | B2 * | 10/2014 | Radosavljevic | H03M 13/1137 714/758 |
| 8,990,661 | B1 | 3/2015 | Micheloni | |
| 2005/0193320 | A1 * | 9/2005 | Varnica | H03M 13/1111 714/800 |
| 2007/0089017 | A1 | 4/2007 | Tang | |
| 2010/0138719 | A1 | 6/2010 | Lee | |

* cited by examiner

[p₀, p₁, p₂, p₃, p₄, p₅, p₆, p₇, p₈, p₉, p₁₀, p₁₁, p₁₂, p₁₃, p₁₄, p₁₅, p₁₆, p₁₇, p₁₈, p₁₉]

| | | | WRITE → |
|---|---|---|---|
| p₀ | p₁ | p₂ | p₃ | p₄ |
| p₅ | p₆ | p₇ | p₈ | p₉ |
| p₁₀ | p₁₁ | p₁₂ | p₁₃ | p₁₄ |
| p₁₅ | p₁₆ | p₁₇ | p₁₈ | p₁₉ |

READ →

| ORIGINAL Decoder Table—SD Locations (Row/Col) |
|---|
| 3/25 7/2 8/30 10/39 11/54 12/0 23/59 |
| 0/21 1/59 2/5 3/21 4/49 13/0 |
| 1/32 2/28 9/4 10/33 11/50 14/0 |
| 2/13 3/43 4/30 5/12 6/21 15/0 |
| 1/42 4/37 5/4 6/48 9/15 16/0 |
| 5/1 7/18 8/37 9/8 10/22 17/0 |
| 0/26 4/29 5/41 6/48 8/35 18/0 |
| 0/14 2/39 3/18 4/36 5/35 19/0 |
| 0/24 2/4 3/16 7/17 11/20 20/0 |
| 1/48 5/23 6/8 7/26 8/4 21/0 |
| 0/6 1/34 9/50 10/0 11/14 22/0 |
| 0/59 1/16 2/32 3/43 4/54 23/0 |

FIG. 7A

| MODIFIED Decoder Table—SD Locations (Row/Col) |
|---|
| 2/13 3/43 5/12 6/21 4/30 14/0 15/0 |
| 0/6 1/34 9/50 10/0 11/14 21/0 22/0 |
| 0/14 2/39 3/18 5/35 4/36 18/0 19/0 |
| 5/23 1/48 6/8 7/26 8/4 20/0 21/0 |
| 1/32 2/28 9/4 10/33 11/50 13/0 14/0 |
| 0/26 4/29 5/41 6/48 8/35 17/0 18/0 |
| 3/16 7/17 0/24 2/4 11/20 19/0 20/0 |
| 1/42 4/37 5/4 6/48 9/15 15/0 16/0 |
| 3/25 7/2 8/30 10/39 11/54 12/0 23/59 |
| DLY DLY DLY DLY DLY DLY DLY |
| 2/5 3/21 0/21 1/59 4/49 12/0 13/0 |

FIG. 7B

LDPC PERFORMANCE IMPROVEMENT USING SBE-LBD DECODING METHOD AND LBD COLLISION REDUCTION

TECHNICAL FIELD

The present disclosure relates generally to systems and methods that implement LDPC coding techniques. More particularly, embodiments of the present disclosure are directed toward systems and methods for i) performing Layered Belief LDPC decoding using Standard Belief LDPC encoded data, and ii) reducing collisions in implementations of Layered Belief LDPC decoders.

BACKGROUND

Low-density parity-check (LDPC) codes are linear error correcting block codes that may be used to transmit data over a noisy transmission channel. LDPC codes are defined by a generator matrix and a sparse parity check matrix. On the transmit/encoding side of a network, the codeword of an input string may be obtained by multiplying the input bit string by the generator matrix. In other words, given a k-bit message $i=\{i_0, i_1, i_2, \ldots, i_{k-1}\}$ that is a vector of length k, a codeword C(i) may be obtained by the expression C(i)=iG, where G is the generator matrix. For example, suppose that i is the three-bit message 010 and G=

$$\begin{pmatrix} 1 & 0 & 0 & 1 & 1 & 1 \\ 0 & 1 & 0 & 1 & 1 & 0 \\ 0 & 0 & 1 & 1 & 0 & 1 \end{pmatrix}.$$

Then the codeword C(i) is 010110 where the first three bits 010 are the original information bits and the last three bits 110 are parity bits obtained from the three information bits.

As the codeword is transmitted over a noisy transmission channel, errors may be introduced into the codeword such that the received vector of bits on the receiver/decoding side is not same as the original codeword (e.g. 1s in positions that should be 0s and 0s in positions that should be 1s.) On the receiver/decoder side of LDPC coding, the parity check matrix may be used to determine if a given received vector of bits is a valid codeword (i.e., has no errors). This can be expressed as $HC(i)^t=0$ where H is r×n parity check matrix, where r=n−k is the number of parity bits in the codeword, n is the number of total bits in the codeword, and $C(i)^t$ is the transpose of the received vector. Each row of the parity check matrix H represents an equation that must be satisfied while each column represents bits in the received codeword.

The parity check matrix may be used to correct errors in received vectors. As shown in FIG. 1, for a particular parity check matrix H, this process of converging on a codeword may be illustrated by a bipartite graph, comprising bit nodes and parity nodes, where each bit node represents a code symbol and each parity node represents a parity equation. A line is drawn between a bit node and a check node if the bit is involved in the parity equation, and decoding is accomplished by passing messages along the lines of the graph.

From check nodes m to bit nodes n, each check node may provide to a connected bit node an estimate of the value of that bit node (i.e., probability that the bit node is 0 or 1) based on the information received from other connected bit nodes. For example, using the illustrated example of FIG. 1, if the sum of $n_4$, $n_5$ and $n_8$ is believed to be 0 to $m_1$, then $m_1$ would indicate to $n_1$ that the value of $n_1$ is believed to be 0 (because this satisfies the parity equation $n_1+n_4+n_5+n_8=0$); otherwise $m_1$ will indicate to $n_1$ that the value of $n_1$ is believed to be 1.

From bit nodes n to check nodes m, each bit node may broadcast to connected check nodes an estimate of its own value based on the information received from other connected check nodes. In the above example, $n_1$ is connected to check nodes $m_1$ and $m_3$. If the information received from $m_3$ to $n_1$ indicates that there is a high probability that the value of $n_1$ is 0, then $n_1$ would notify $m_1$ that an estimate of $n_1$'s value is 0. As another example, in cases where the bit node has more than two connected check nodes, the bit node may rely on a majority vote (soft decision) the feedback coming from its other connected check nodes before reporting that soft decision to the check node. The above process may be repeated iteratively until all bit nodes are considered to be correct (i.e., all parity check equations are satisfied) or until a predetermined maximum number of iterations is reached, whereby a decoding failure may be declared.

Standard belief decoding is an LDPC decoding scheme that applies the process described above. In SBD, the decoder works through each and every one of the rows of the parity check matrix, one by one. After working through every row of the parity check matrix, the bit nodes are then updated and the process may iterate. By contrast, in the more recently developed LDPC layered-belief decoding (LBD) scheme, information gained going through each row of the parity check matrix (i.e., each equation) may be used when making decisions in subsequent rows. Particularly, after solving a parity equation for one row, soft decisions on bit nodes are stored and made available so that the decoder may use this information immediately when considering another row (i.e., check node) of the parity check matrix. This process is described in greater detail in U.S. Pat. No. 8,402,341. Consequently, LBD typically converges on a codeword using about half as many iterations as SBD. Additionally, in LBD, each iteration takes about roughly half the time as in SBD, thus providing much higher throughput. Accordingly, LBD may provide significant advantages over SBD.

SUMMARY

In accordance with embodiments of the disclosed technology, systems and methods are described for i) performing Layered Belief LDPC decoding using Standard Belief LDPC encoded data, and ii) reducing collisions in implementations of Layered Belief LDPC decoders.

In a first embodiment, a receiver includes a demodulator and a decoder. The demodulator is configured to demodulate a signal received over a communication channel, where the demodulated signal includes a noise corrupted signal derived from a codeword encoded using standard belief LDPC encoding. The decoder is configured to convert the noise corrupted signal derived from the standard belief LDPC encoded codeword to a noise corrupted signal derived from a layered belief LDPC encoded codeword; and decode the noise corrupted signal derived from the layered belief LDPC encoded codeword using a layered belief LDPC decoder. In particular implementations, the communication channel is a satellite network communication channel, the receiver is a receiver of a satellite gateway, and the codeword was encoded by a user satellite terminal.

In implementations, converting the noise corrupted signal includes receiving a codeword of the form $[i_0, i_1, i_2, \ldots, i_{k-1}, p_0, p_1, p_2, \ldots, p_{n-k-1}]$, where k is a number of information bits, n is a total number of bits, and n−k is a number of parity bits, and changing it to the form $[i_0, i_1, i_2, \ldots, i_{k-1}, p_0, p_1, p_2, \ldots, p_{(M-1)}W, p_1, p_{W+1}, p_{2W+1}, \ldots, p_{n-k-1}]$, where M is a number of parallel computation engines and $W=(n-k)/M$.

In a second embodiment, a method includes: receiving an original layered belief LDPC decoder table, the original layered belief LDPC decoder table including multiple rows, each row associated with a group of parity check equations and containing elements, where each of the elements specifies a location in a random access memory (RAM) where a soft decision is stored; and modifying the original layered belief LDPC decoder table by increasing the distance between a first element and a second element of the original decoder table that specify a same location in the RAM. In implementations, modifying the original layered belief LDPC decoder table includes at least one of the following operations: rearranging two or more of the rows; rearranging two or more elements within one of rows; or adding a spacer row between two of the rows.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 4 shows a parity bit table illustrating an example SBE to LBE conversion process for a codeword including 20 parity bits and 4 parallel computation engines.

FIG. 7A illustrates an original decoder table for the LBD decoder of FIG. 5 that comprises elements specifying the locations of soft decisions stored in RAM.

FIG. 7B illustrates a modified decoder table, after modifying the original decoder table of FIG. 7A.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

As noted above, Layered Belief LDPC decoding (LBD) may provide significant throughput and convergence speed advantages over Standard Belief LDPC decoding (SBD). However, in current implementations of communication systems, Standard Belief LDPC encoding (SBE) is widely used by transmitters. Layered Belief LDPC encoding (LBE) is not supported by the majority of existing transmitters in use today. This is particularly the case in current satellite communication systems where user terminal transmitters (e.g., VSAT terminals) encode data using SBE. Short of replacing the user terminal transmitters with LBE compatible hardware, which is unfeasible and costly, users of receivers that receive the SBE messages must use SBD even when the receivers themselves are capable of performing LBD.

Embodiments of the technology disclosed herein address these issues by providing a system and method for performing LBD on received SBE data bursts. Particularly, SBE data received at the receiver is first converted to LBE data, and then the LBE data is decoded using a LBD. Using this SBE-LBD decoding method, receivers that utilize LBD may realize the higher throughput and faster convergence benefits even when SBE data bursts are received by the receiver. Further still, newer receivers that employ an LBD scheme may be made backward compatible with existing transmitters that only support SBE.

In further embodiments of the technology disclosed herein, systems and methods are described for reducing collisions in LBD decoders that occur when multiple parity checks need the same soft decision at the same time. In accordance with embodiments, elements in an original LBD decoder table are rearranged to increase the distance between elements specifying the same location in a RAM where soft decisions are stored. In implementations, the original LBD decoder table may be modified as follows to reduce collisions: two or more rows of the original LBD decoder table may be rearranged, the elements of a given row may be rearranged, and spacer rows may be added into the table.

SBE-LBD Decoding System and Method

FIG. 1A illustrates an exemplary communication system in which the disclosed technology may be implemented to provide SBE-LBD decoding. It should be noted that although embodiments disclosed herein will be described primarily with reference to satellite communication systems, the disclosed SBE-LBD system and method may be implemented in other communication systems that utilize SBE/SBD and LBE/LBD coding schemes.

Figure 1:
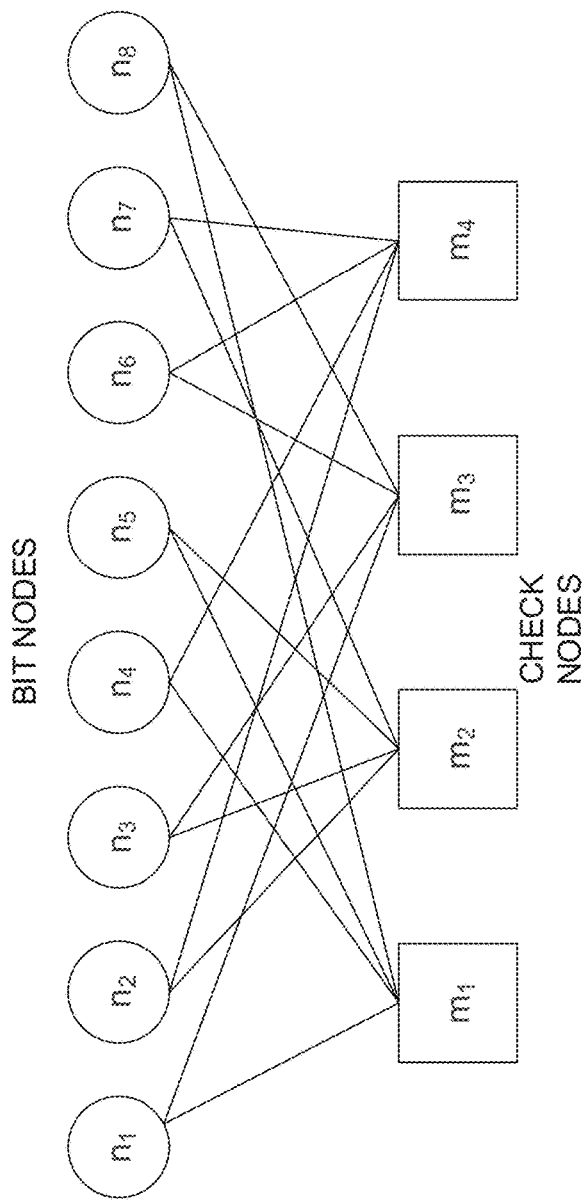
FIG. 1 shows a parity bit matrix and a bipartite graph showing a process of converging on a codeword using LDPC coding.

As shown in the communication system of FIG. 1A, a transmitter 100 may transmit an SBE data signal over a communication channel 200 to a receiver 300. In various embodiments, the data signal may carry image, video, audio, and other information. During transmission, the data signal may be corrupted by noise. Transmitter includes an encoder 110 that includes an SBE module 120 that encodes user data (i.e., an input bit stream) using standard belief LDPC encoding. For example, SBE module 120 may generate codewords on an input bit stream using generator matrices that output codewords having a certain number of parity bits. In the exemplary communication environment of FIG. 1, receiver 300 is able to receive the noisy SBE data signal and decode it using LBD. Receiver 300 comprises a decoder 310 with SBE to LBE encoding conversion module 311 and an LBD module 312. As will be further described below, SBE to LBE conversion module 311 receives as an input a noisy SBE data signal and outputs a noisy LBE data signal by changing the positions of parity bits within the SBE data signal. LBD module 312 may then decode the converted LBE signal output by conversion module 311.

With reference now to FIG. 1B, which illustrates an exemplary satellite communication system in which transmitter 100 and receiver 300 may be implemented, in one exemplary embodiment transmitter 100 includes SBE encoder 110, an interleaver 120, a modulator 130, a transmit filter 140, and a mixer 150. In embodiments, transmitter 100 may be a transmitter of a user terminal, such as, for example, a very small aperture terminal (VSAT). Although the components of transmitter 100 are shown in a particular order in this example, one of ordinary skill in the art reading this description will understand that the order of components can be varied and some components may be excluded. One of ordinary skill in the art will understand how other transmitter configurations can be implemented, and that one or more of these components can be implemented in either digital form (e.g., as software running on a DSP or other processing device, with the addition of a DAC) or as analog components.

Bit source 102 provides information bits to be transmitted to SBE encoder 110. The information can include, for example, images, video, audio, text and other data. As described above, SBE encoder 110 performs forward error correction by using Standard Belief LDPC encoding to add redundancy to information data bits signal 102 using parity bits. By adding redundant information to the data being transmitted through the channel, this improves the capacity of the channel.

Interleaver 120 scrambles the encoded data bits by rearranging the bit sequence order to make distortion at receiver 300 more independent from bit to bit. In other words, interleaver 106 rearranges the ordering of the data sequence in a one to one deterministic format. Modulator 130 modulates the interleaved bits using a bit-to-symbol modulation scheme to form complex-valued data symbols. The interleaved bits may be modulated using any of a number of different modulation techniques. Examples of modulation schemes that can be implemented include Amplitude Phase Shift Keying (APSK), Quadrature Phase Shift Keying (QPSK), n/M-MPSK, other orders of Multiple Phase Shift Keying MPSK, Quadrature Amplitude Modulation (QAM), and so on.

Subsequently, transmit filter 140 converts the complex-valued data symbols to a waveform signal using a pulse shaping function with an impulse response. Examples of transmit filters that may be implemented include root-raised cosine (RRC) filters and partial response filters. Following filtering of the transmit signals at filter 140, mixer 150 of transmitter 100 mixes the waveform signal of the filter outputs with a carrier signal z(t) from a local oscillator (not shown) to modulate it onto an appropriate carrier for transmission. In embodiments, the carrier signal function $z_m(t)$ for a particular carrier m may be represented as $$\frac{1}{\sqrt{M_c}} e^{j(2\pi f_m t + \theta_m)},$$

where $f_m$ is the center frequency and $\theta_m$ is the carrier phase of m-th channel.

In embodiments where the satellite communication system is a multicarrier system, an adder (not shown) may be provided to add output signals from a plurality of transmitting carrier sources and provide a composite signal. The output signal from the transmitter (e.g., a composite signal) is transmitted to satellite transponder 200. At transponder 200, the signal may be processed through an input multiplexing (IMUX) filter (not shown) to select the desired carrier, amplified (e.g., using a traveling-wave tube amplifier), and output using an output multiplexing (OMUX) filter.

On the downlink reception side, receiver 300 receives an input signal on a carrier from satellite transponder 200 and outputs an estimate of the carrier's bits. In this exemplary embodiment, receiver 300 includes a mixer 320, a matching receiver filter 330, a corresponding demodulator 340, a deinterleaver 350, and an SBE-LBD decoder. 310. In embodiments, receiver 300 may be a receiver of a satellite gateway. Although the components of receiver 300 are shown in a particular order in this example, one of ordinary skill in the art reading this description will understand that the order of components can be varied and some components may be excluded. One of ordinary skill in the art will understand how other receiver configurations can be implemented, and that one or more of these components can be implemented in either digital form (e.g., as software running on a DSP or other processing device, with the addition of a DAC) or as analog components.

As illustrated, mixer 320 mixes the input waveform signal received from transponder 200 with a carrier down conversion signal e(t) from a local oscillator (not shown) to downconvert the received signal to baseband. In embodiments, the carrier down conversion signal may be represented as $e^{-j(2\pi f_m t + \theta_m)}$ is the center frequency and $\theta_m$ is the carrier phase of the m-th channel. At block 330, a receiver filter corresponding to (i.e., matched to) transmit filter 140 is applied to the downsampled carrier signal. Subsequently, at demodulator 340 the signal is demodulated using a symbol-to-bit demodulation scheme that reverses the bit-to-symbol modulation of transmitter modulator 130. For example, demodulator 340 may implement demodulation schemes such as APSK, QPSK, MPSK, QAM and so forth. The demodulated signal may then pass through deinterleaver 350, which reverses the function of interleaver 120.

Figure 3A:
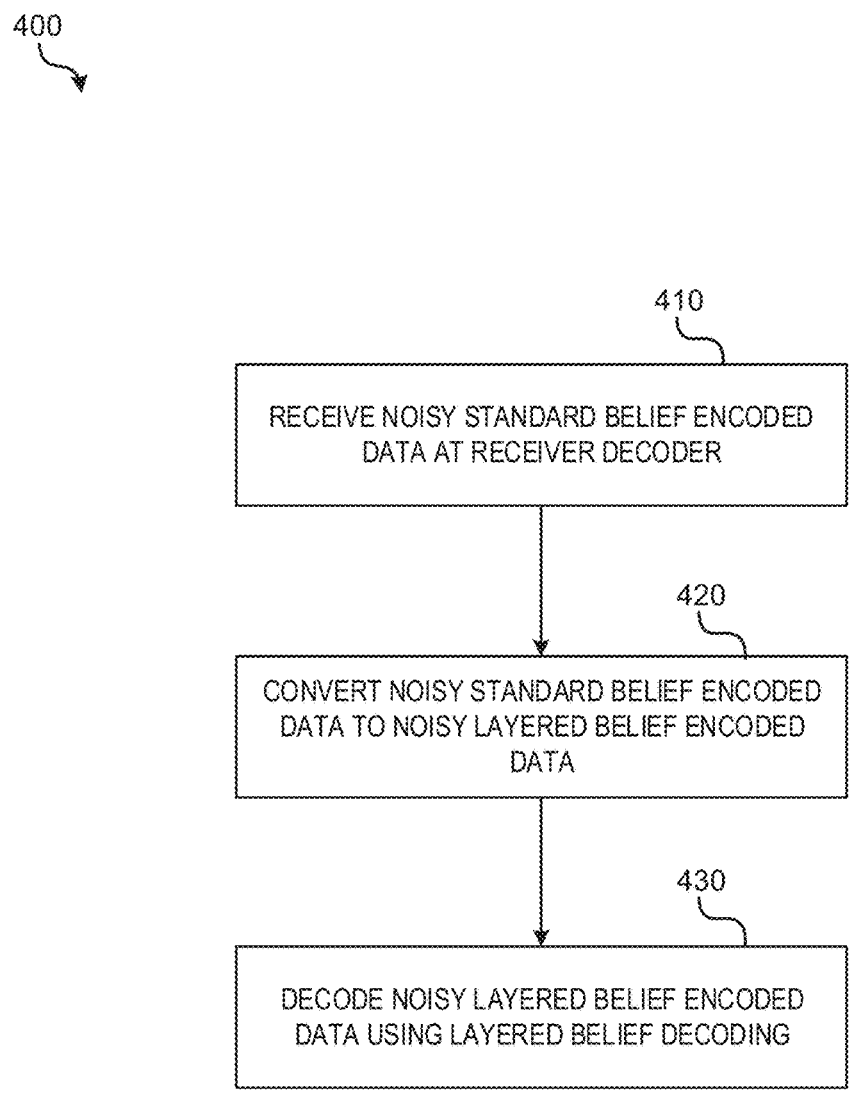
FIG. 3A is an operational flow diagram illustrating an example method that may be implemented by a receiver in accordance with example embodiments of the disclosed technology.
Figure 3B:
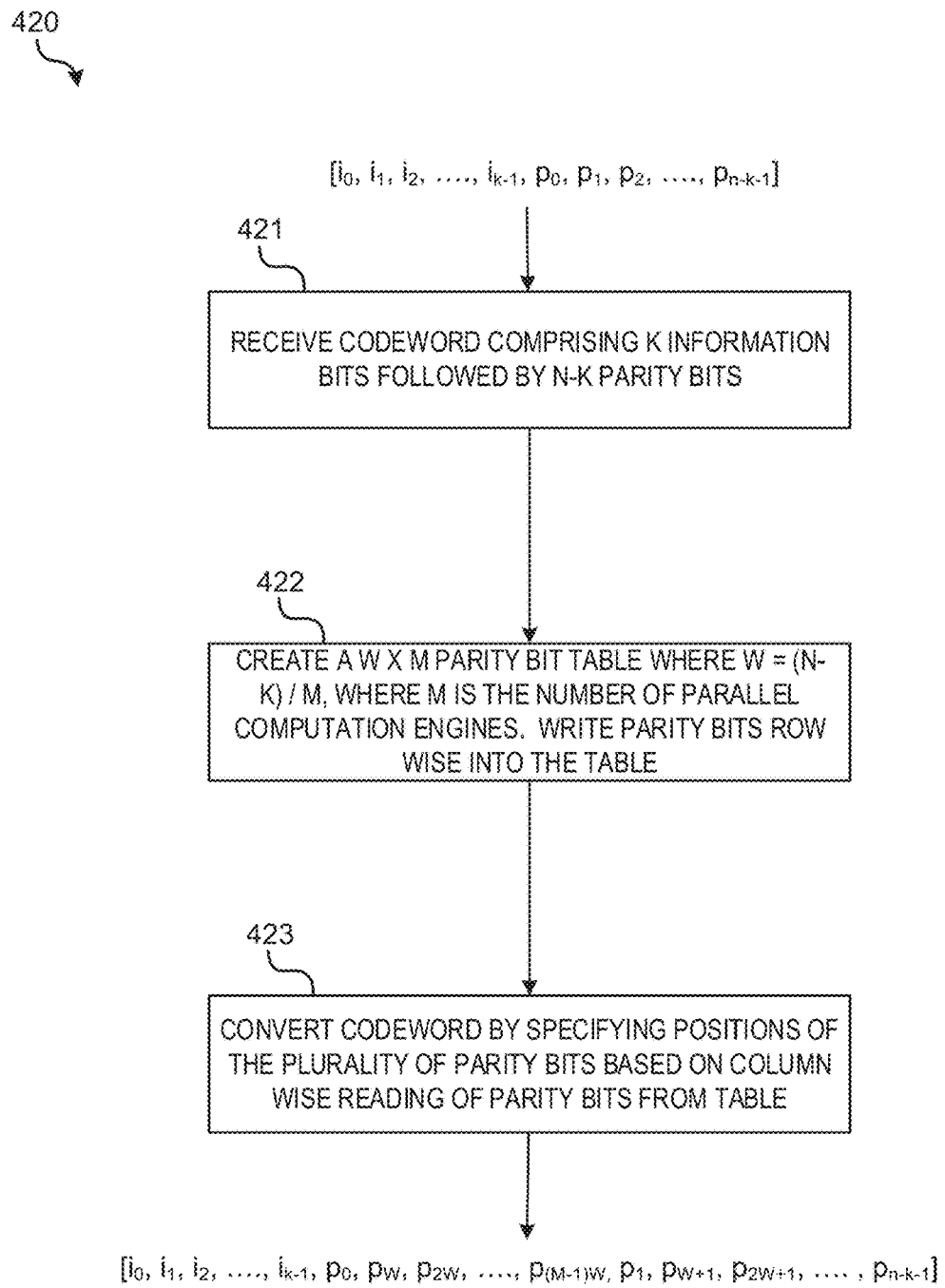
FIG. 3B is an operational flow diagram illustrating an example method of converting SBE encoded data to LBE encoded data in accordance with example embodiments of the disclosed technology.

SBE-LBD decoder 310 then decodes the demodulated signal, which includes data that was encoded using SBE. In embodiments, decoder 310 employs M parallel engines to efficiently decode the received signals. For example, M may correspond to the groupings of M bit nodes for processing. The operation of SBE-LBD decoder is illustrated by FIGS. 3A and 3B, which illustrate a method 400 for decoding received SBE encode data using LBE.

At operation 410, noisy SBE encoded data is received at SBE-LBD decoder 310. As noted above, noise may have been introduced into the data signal during transmission from the transmitter to the receiver. The noisy SBE encoded data may be received as a data burst comprising a plurality of SBE coded codewords (e.g., codewords contained in packets of the data burst). At operation 420, the noisy SBE encoded data is converted to noisy LBE encoded data by changing the position of the parity bits within the encoded data while passing through the information bits without changing their positions. FIG. 3B illustrates an exemplary implementation of operation 420 with respect to a received SBE encoded codeword. At operation 421, an SBE encoded codeword is received. The received SBE encoded codeword including k information bits, and n total bits may be represented by vector Form (1):

$$C_{SBE} = [i_0, i_1, i_2, \ldots, i_{k-1}, p_0, p_1, p_2, \ldots, p_{n-k-1}] \quad (1)$$

Where $[i_0, i_1, i_2, \ldots, i_{k-1}]$ are information bits, $[p_0, p_1, p_2, \ldots, p_{n-k-1}]$ are parity bits, and there are n–k total parity bits.

At operation 422, a W×M parity bit table may be defined where W=(n–k)/M, where n–k is the number of parity bits and M is the number of parallel computation engines of decoder 310. This is illustrated by FIG. 4, which shows a parity bit table illustrating an example SBE to LBE conversion process for a codeword or vector including 20 parity bits and 4 parallel computation engines. As shown, each parity bit of vector (1) is sequentially written "row wise" into the table. At operation 423, the codeword may be converted by specifying the new positions of the parity bits based on a "column wise" reading of the parity bits of the table.

More generally, the output LBE encoded codeword may be represented by Form (2):

$$C_{SBE-LBE} = [i_0, i_1, i_2, \ldots, i_{k-1}, p_0, p_W, p_{2W}, \ldots, p_{(M-1)W}, p_1, p_{W+1}, p_{2W+1}, \ldots, p_{n-k-1}] \quad (2)$$

Where M is the number of parallel computation engines used by the encoder and W=(n–k)/M. It should be noted that the process for converting an input SBE codeword to an LBE codeword need not be limited to using a table. As would be appreciated by one having skill in the art, any process that takes an input codeword or vector of Form (1) and outputs a codeword or vector of Form (2) may be suitable. For example, instead of using a table, a W×M parity bit matrix may be transposed and read "row wise."

In one embodiment, the SBE-LBE conversion algorithm may be implemented using the following source code:

```
Initialize W = (N–K)/M; i=0; j=0
While (i < W) do
    While (j<M) do
        DI_conv(K+i*M+j) = DI (K+j*W+i);
        j =j +1
    End
    i=i+1
End
```

Where N is a number of encoded bits, K is a number of input information bits, M is a number of parallel computation engines, DI is an original decoder input array of SBE format (i.e., the input codeword), and DI_conv is a converted decoder input array of LBE format that is passed to a LBD decoder. As would be appreciated by one having skill in the art, the conversion algorithm, in embodiments, need not be coded in this precise form, and any code that takes an input vector of the form $[i_0, i_1, i_2, \ldots, i_{k-1}, p_0, p_1, p_2, \ldots, p_{n-k-1}]$ and changes it to the form $[i_0, i_1, i_2, \ldots, i_{k-1}, p_0, p_W, p_{2W}, \ldots, p_{(M-1)W}, p_1, p_{W+1}, p_{2W+1}, \ldots, p_{n-k-1}]$ may be suitable.

Subsequently, after conversion, at operation 430 the noisy LBE encoded data is decoded using LBD.

Figure 5:
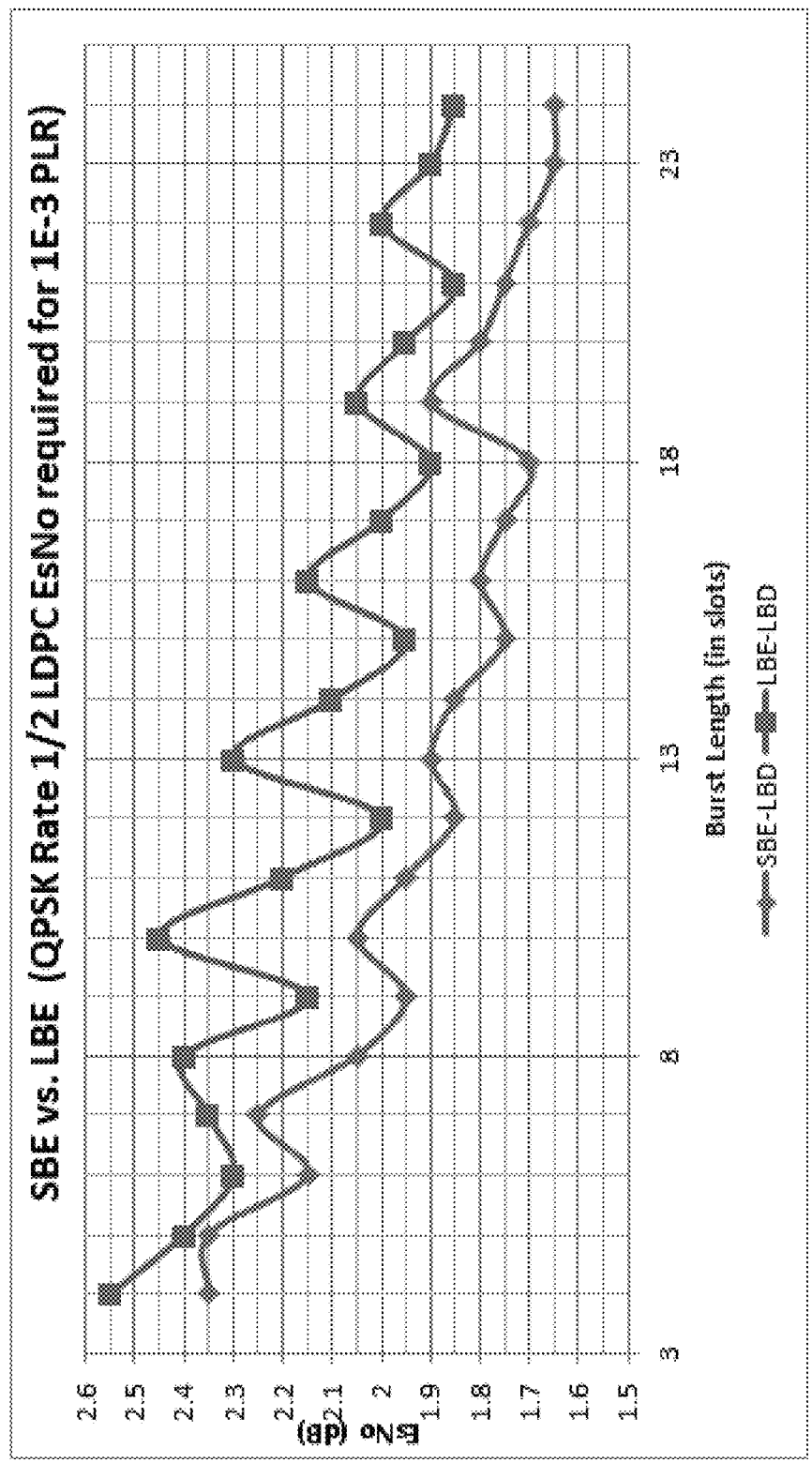
FIG. 5 is a plot illustrating the mean symbol energy to noise ratio (EsNo) in decibels as a function of the burst length in slots for QPSK modulated signals that was required to achieve a packet loss rate (PLR) of 1E-3 using an LBE-LBD scheme and using an SBE-LBD scheme.

FIG. 5 is a plot illustrating the mean symbol energy to noise ratio (EsNo) in decibels as a function of the burst length in slots for QPSK modulated signals that was required to achieve a packet loss rate (PLR) of 1E-3 using an LBE-LBD scheme and using an SBE-LBD scheme. In this example, each slot contains 240 bits. As illustrated, to achieve a 1E-3 PLR, the SBE-LBD scheme requires less power than the regular LBE-LBD scheme requires across all burst lengths (or code sizes). The EsNo benefits are especially significant for derived codes.

Collision Reduction in Layered Belief LDPC Decoder

Figure 6:
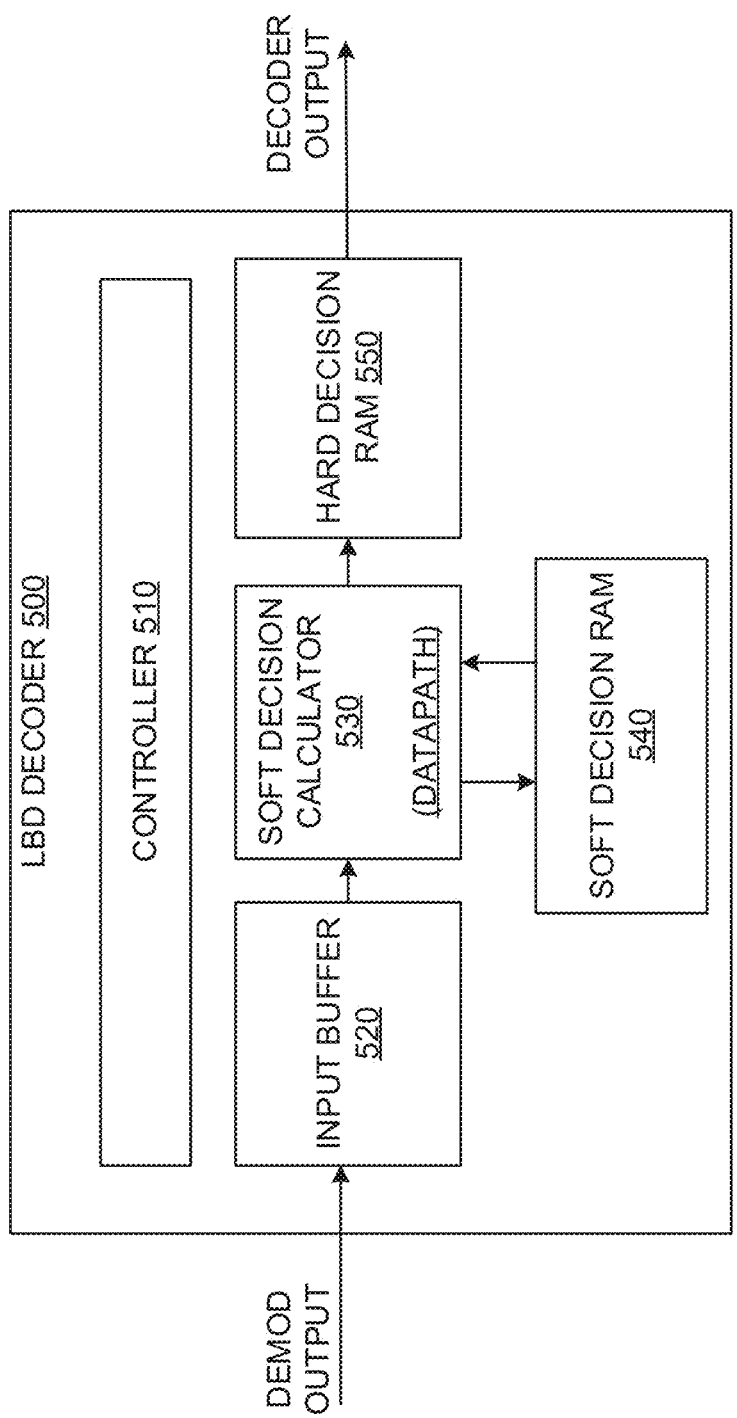
FIG. 6 is a block diagram showing an LBD decoder that may be implemented to decode codewords in accordance with example embodiments.

FIG. 6 is a block diagram showing an example LBD decoder that may be implemented to decode codewords with collision reduction in accordance with example embodiments. As shown, LBD decoder 500 comprises a controller 510 for controlling the operation of decoder 500, input buffer 520 for buffering an incoming demodulated data signal, soft decision calculator 530, soft decision ram 540, and hard decision ram 550.

Figure 2A:
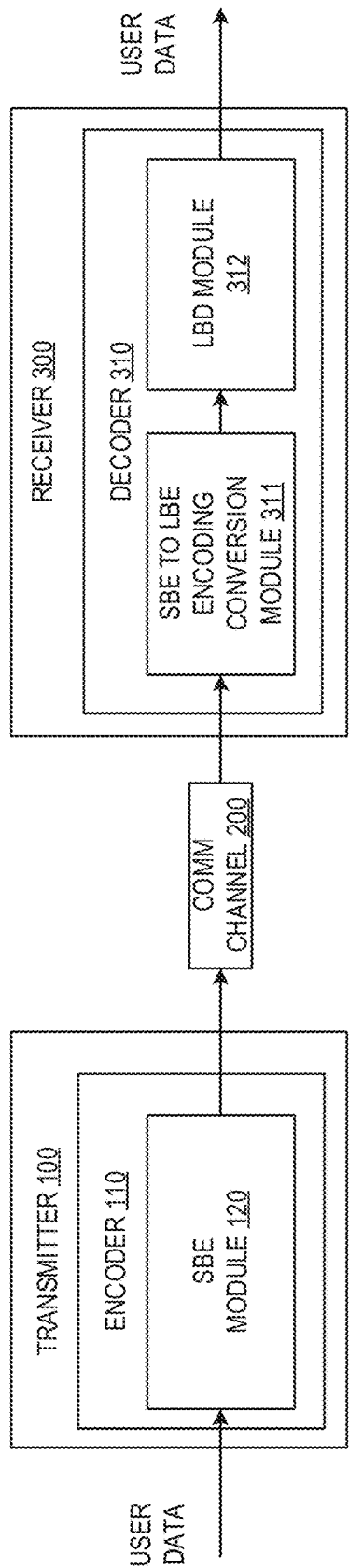
FIG. 2A illustrates an exemplary communication system in which the disclosed technology may be implemented.
Figure 2B:
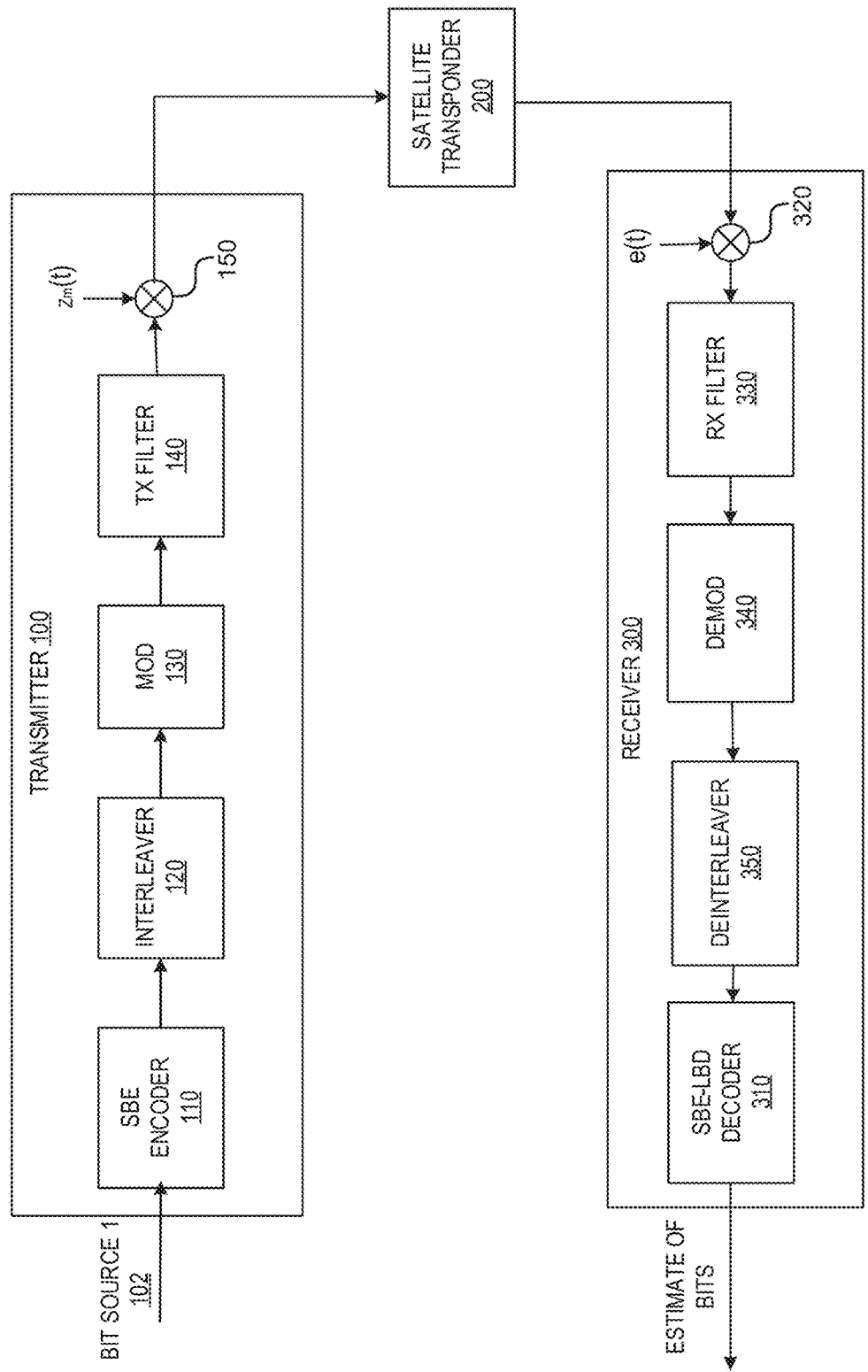
FIG. 2B illustrates an exemplary satellite communication system in which the disclosed technology may be implemented.

During operation, LBD decoder 500 receives LBE codewords of a demodulated signal and decodes the codewords (i.e., for each vector, determines the most likely codeword that was received) by applying an LBD decoding process. In some embodiments, LBD decoder 500 may be implemented in the systems illustrated by FIGS. 2A-2B through the use of an SBE to LBE encoding conversion module (e.g. module 311) that converts SBE encoded codewords to LBE encoded codewords.

As described above, in an LDPC-based decoder, a soft decision represents the probability of a received data bit being a 0 or 1. As each received codeword contains N data bits, N soft decisions are made with respect to received codewords. These soft decisions are calculated and updated using soft decision calculator 530 and stored in soft decision RAM 540. After a certain number of iterations, hard decision RAM stores hard decisions (i.e., a decision that a bit is definitely 0 or 1) about the values of the received data bits. For example, if the probability of a bit being 1 or 0 exceeds a predetermined threshold, a hard decision is made about the bit's value.

With respect to calculating and storing the soft decisions, LBD decoder 500 may store a plurality of soft decisions in the same row of the soft decision RAM 540. This provides parallelism in decoding operations and provides higher decoding throughput. Mathematically, the number of rows q a codeword occupies in soft decision RAM 540 may be represented as q=N/M, where N is the number of data bits and M is the number of parallel computation engines (i.e., same as number of soft decisions stored in the same row of RAM).

FIG. 7A illustrates an original LBD decoder table 600 that is used during decoding in conventional LBD decoders that employ parallelism. Each row of the original decoder table is associated with a group of M parity check equations, and each element of each row specifies a location in soft decision ram 540 (i.e., the row/column) where a soft decision value is stored. As alluded to above, in LBD decoding, soft decisions on bit nodes are stored in RAM and made available so that the decoder may use this information immediately when considering another row. In other words, each time a group of parity check equations are used, the updated soft decision values of bits are written back into the soft decision RAM 540 so that they may be used in using other parity check equations.

Although this process increases the speed of decoding, collisions (i.e., conflicts) may occur if, due to the hardware latency associated with using a parity check equation, a soft decision is not written back into soft decision RAM 540 before a subsequent parity check reads the soft decision from soft decision RAM 540. If the soft decision RAM 540 is read before it is updated, the subsequent parity check does not use the updated soft decision value. Collisions are illustrated by highlighted elements in original LBD decoder table 600. For example, the first parity check equation (row 1 of the table) estimates and stores decision values in row 3 of RAM 540 (value 3/25) and row 12 of RAM 540 (value 12/0). In solving a subsequent parity check equation (row 2 of the table), rows 3 and 12 of RAM 540 are read from before the results from solving the first parity check equation are written into RAM. Accordingly, collisions occur with respect to soft decisions values of these bits.

As shown by subsequent highlighted values in original decoder table 600, many collisions (35 in this example) may occur if subsequent parity checks attempt to use soft decision values before they are written into RAM from a prior parity check. Such a significant number of collisions may degrade the PLR versus EsNo performance of the decoder. This is problematic as increasing the number of decoder iterations does not considerably improve the PLR versus EsNo performance.

Embodiments disclosed herein reduce the number of collisions by rearranging the locations of soft decisions in an original decoder table to generate a modified decoder table. The modified decoder table increases the distance between elements specifying the same location (i.e., row) in soft RAM to avoid collisions. By way of example, consider the first element 3/25 of original decoder table 600. The next element that uses RAM memory address 3 is the fourth element of the second row, 3/21. In this example, there are nine elements between 3/25 and 3/21 and a collision occurs. Accordingly, hardware latencies may dictate that there needs to be greater than 9 elements (e.g., 11 elements) between the occurrences of two elements that use the same memory address of RAM so that there is enough time to write to the memory address before it is read again.

Figure 8:
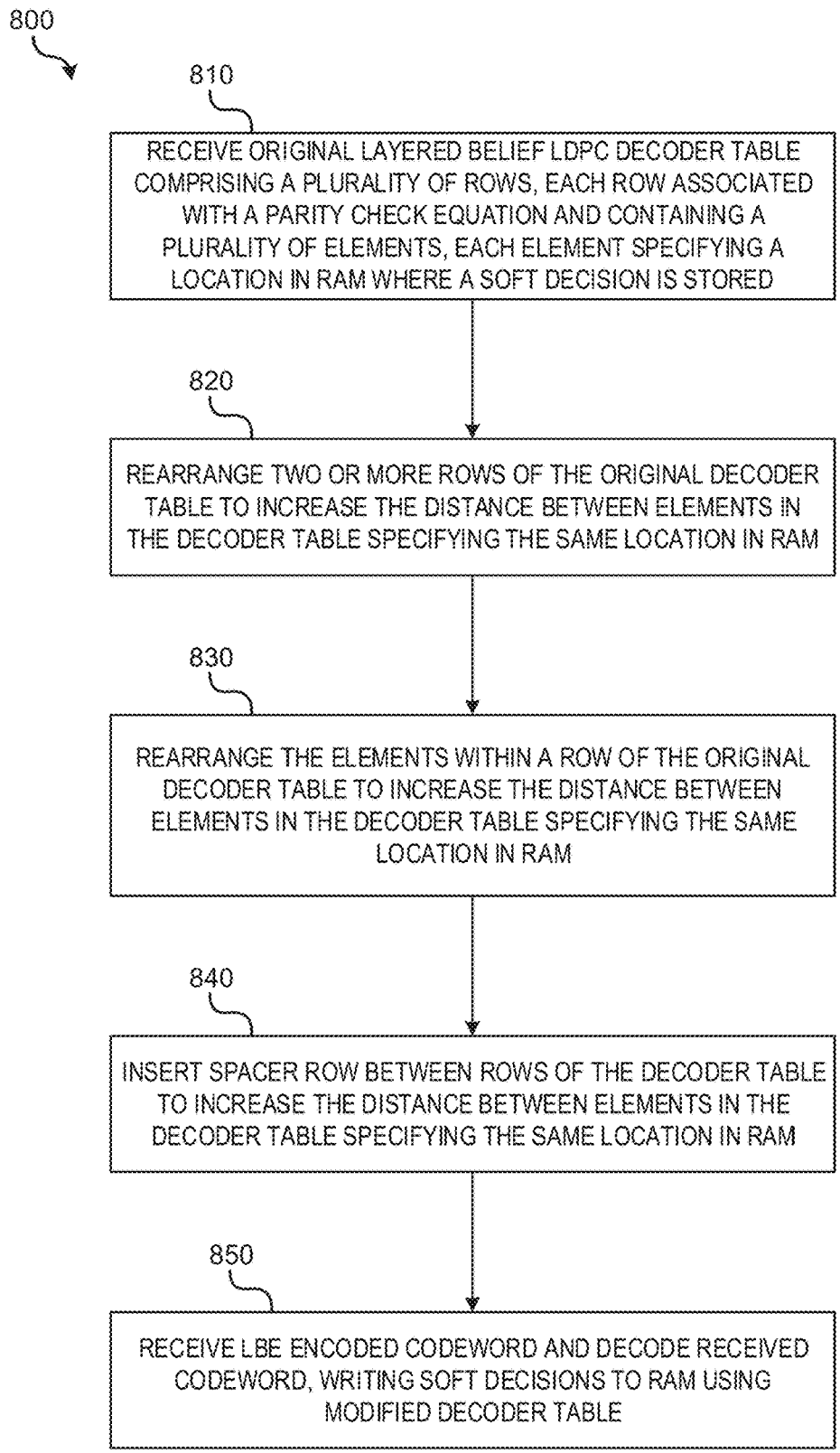
FIG. 8 is an operational flow diagram illustrating an example method of modifying an original decoder table of an LBD decoder to reduce collisions.

FIG. 8 is an operational flow diagram illustrating an example process 800 of modifying an original decoder table of an LBD decoder to reduce collisions. Method 800 will be described with exemplary reference to FIGS. 7A-7B, which respectively shown original decoder table 600 and an example modified decoder table 700 that may be generated by process 800.

At operation 810, an original LBD decoder table is received. For example, original decoder table 700 may be received. Subsequently, at operation 820, two or more rows of the original decoder table may be rearranged to increase the distance between elements specifying the same location in RAM (e.g., soft decision RAM 540). For example, in modified decoder table 700, the first row in original decoder table 600 is the third to last row and the fifth row in original decoder table 600 is the eighth row. In this new arrangement, no collisions occur for any of the elements of rows 5 and 8 of modified decoder table 700.

At operation 830, the elements within a row of the decoder table are rearranged. In embodiments, operation 830 may be applied to a plurality of rows. In further embodiments, a combination of operations 820 (movement of row) and 830 (rearrangement of elements within the row) may be applied to the rows. For example, in modified decoder table 700, the last row is the second row of original decoder table 600 with some of its elements rearranged. At operation 840, one or more spacer rows are added between rows of the decoder table. For example, in modified decoder table 700 the second from the last row is a spacer row. As shown, the spacer row may contain the same number of elements as other rows of the modified decoder table. As the spacer row is processed like other rows in the parity check matrix, but does not store or read soft decisions into/from RAM, it introduces a computation delay between read/write operations on the same RAM address.

As would be appreciated by one having ordinary skill in the art, operations 820-840 may be performed in any order to generate a modified decoder table that increases the distance between elements specifying the same location in RAM. Correspondingly, this increases the amount of time between read/write operations on the same memory address in RAM, thereby reducing collisions. As these table modification operations (rearrangement of rows, rearrangement of elements within a row, addition of spacer rows) do not change the set of parity equations, the modified decoder table 700 may be used to decode data.

Following creation of the modified table, at operation 850 the LBE encoder (e.g., encoder 500) may receive and decode LBE encoded codewords, writing soft decisions to soft ram (e.g., soft ram 540 using the modified decoder table). For example, using modified decoder table 700, the number of collisions was reduced from 35 to 4. In some embodiments, the number of collisions may be reduced to 0. As would be appreciated by one having skill in the art, in various embodiments the arrangement of rows and elements in the modified decoder table may be optimized to reduce collisions based on: the minimum amount of hardware time needed to read from or write to a memory address of soft RAM as may be determined by clock speeds, the latency of soft decision calculator circuitry, the number of elements in each row of the decoder table, the total number of rows in the decoder table, and other like factors.

Figure 9:
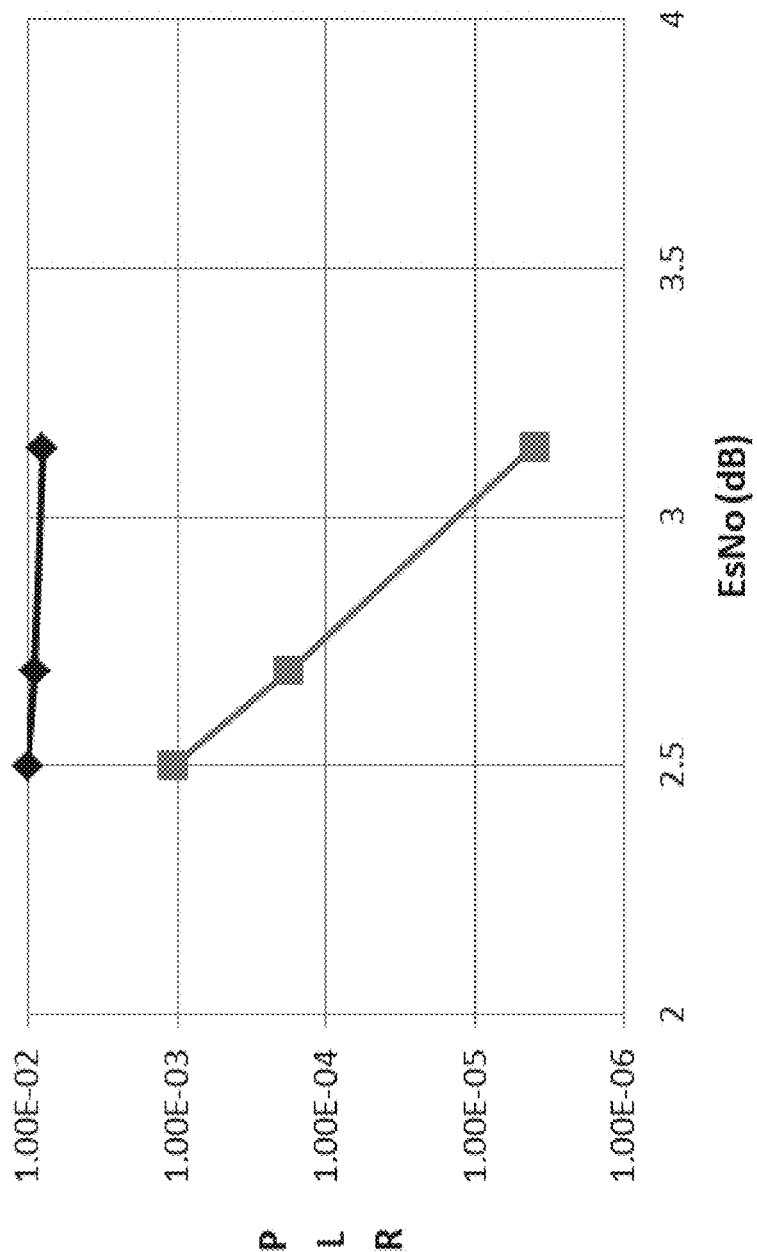
FIG. 9 is a plot illustrating the PLR versus EsNo performance of an LBD decoder that uses an original decoder table and of an LBD decoder that uses a decoder table modified in accordance with the method of FIG. 8.

FIG. 9 is a plot illustrating the PLR versus EsNo performance of an LBD decoder that uses an original decoder table and of an LBD decoder that uses a decoder table modified in accordance with the method of FIG. 8. As illustrated, using the original decoder table, an improvement in a received signal's EsNo does not appreciably improve the PLR during decoding. The error rate remains about the same even with the increased signal to noise ratio. By contrast, with collision reduction from using the modified decoder table, an improved PLR (several orders of magnitude lower) may be realized as the EsNo of the received signal improves. In some embodiments, using a modified decoder table the LBD decoder may realize performance the same as the theoretical minimum PLR achievable through the original decoder table.

Figure 10:
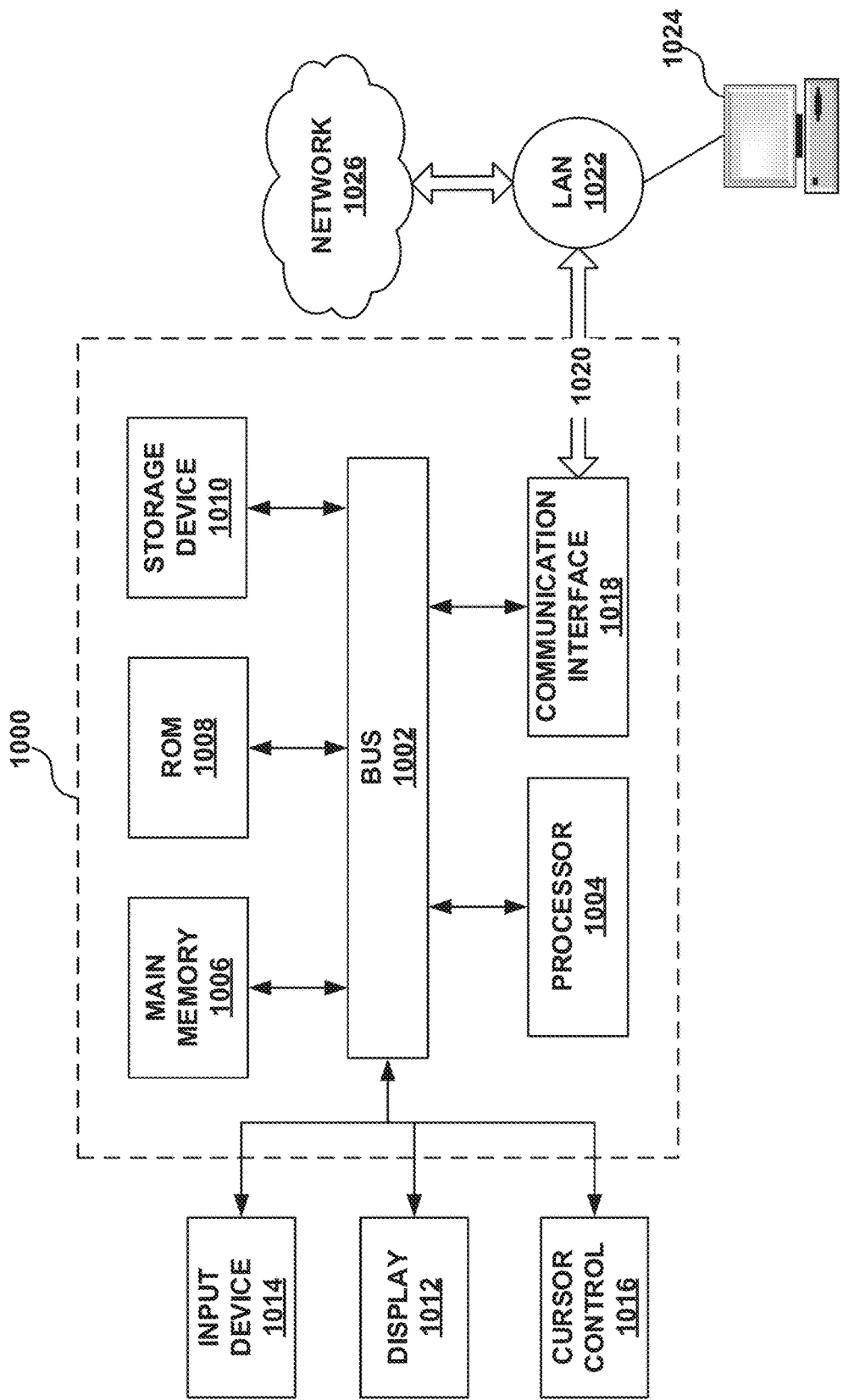
FIG. 10 illustrates an example computing module that may be used in implementing features of various embodiments.

FIG. 10 illustrates a computer system 1000 upon which example embodiments according to the present disclosure can be implemented. Computer system 1000 can include a bus 1002 or other communication mechanism for communicating information, and a processor 1004 coupled to bus 1002 for processing information. Computer system 1000 may also include main memory 1006, such as a random access memory (RAM) or other dynamic storage device, coupled to bus 1002 for storing information and instructions to be executed by processor 1004. Main memory 1006 can also be used for storing temporary variables or other intermediate information during execution of instructions to be executed by processor 1004. Computer system 1000 may further include a read only memory (ROM) 1008 or other static storage device coupled to bus 1002 for storing static information and instructions for processor 1004. A storage device 1010, such as a magnetic disk or optical disk, may additionally be coupled to bus 1002 for storing information and instructions.

Computer system 1000 can be coupled via bus 1002 to a display 1012, such as a cathode ray tube (CRT), liquid crystal display (LCD), active matrix display, light emitting diode (LED)/organic LED (OLED) display, digital light processing (DLP) display, or plasma display, for displaying information to a computer user. An input device 1014, such as a keyboard including alphanumeric and other keys, may be coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012.

According to one embodiment of the disclosure, SBE-LBD decoding or creation of modified LBD decoder tables, in accordance with example embodiments, are provided by computer system 1000 in response to processor 1004 executing an arrangement of instructions contained in main memory 1006. Such instructions can be read into main memory 1006 from another computer-readable medium, such as storage device 1010. Execution of the arrangement of instructions contained in main memory 1006 causes processor 1004 to perform one or more processes described herein. One or more processors in a multi-processing arrangement may also be employed to execute the instructions contained in main memory 1006. In alternative embodiments, hard-wired circuitry is used in place of or in combination with software instructions to implement various embodiments. Thus, embodiments described in the present disclosure are not limited to any specific combination of hardware circuitry and software.

Computer system 1000 may also include a communication interface 1018 coupled to bus 1002. Communication interface 1018 can provide a two-way data communication coupling to a network link 1020 connected to a local network 1022. By way of example, communication interface 1018 may be a digital subscriber line (DSL) card or modem, an integrated services digital network (ISDN) card, a cable modem, or a telephone modem to provide a data communication connection to a corresponding type of telephone line. As another example, communication interface 1018 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1018 sends and receives electrical, electromagnetic, or optical signals that carry digital data streams representing various types of information. Further, communication interface 1018 may include peripheral interface devices, such as a Universal Serial Bus (USB) interface, a PCMCIA (Personal Computer Memory Card International Association) interface, etc.

Network link 1020 typically provides data communication through one or more networks to other data devices. By way of example, network link 1020 can provide a connection through local network 1022 to a host computer 1024, which has connectivity to a network 1026 (e.g. a wide area network (WAN) or the global packet data communication network now commonly referred to as the "Internet") or to data equipment operated by service provider. Local network 1022 and network 1026 may both use electrical, electromagnetic, or optical signals to convey information and instructions. The signals through the various networks and the signals on network link 1020 and through communication interface 1018, which communicate digital data with computer system 1000, are example forms of carrier waves bearing the information and instructions.

Computer system 1000 may send messages and receive data, including program code, through the network(s), network link 1020, and communication interface 1018. In the Internet example, a server (not shown) might transmit requested code belonging to an application program for implementing an embodiment of the present disclosure through network 1026, local network 1022 and communication interface 1018. Processor 1004 executes the transmitted code while being received and/or store the code in storage device 1010, or other non-volatile storage for later execution. In this manner, computer system 1000 obtains application code in the form of a carrier wave.

The term "computer-readable medium" as used herein refers to any medium that participates in providing instructions to processor 1004 for execution. Such a medium may take many forms, including but not limited to non-volatile media, volatile media, and transmission media. Non-volatile media include, for example, optical or magnetic disks, such as storage device 1010. Volatile media may include dynamic memory, such as main memory 1006. Transmission media may include coaxial cables, copper wire and fiber optics, including the wires that comprise bus 1002. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. By way of example, the instructions for carrying out at least part of the present disclosure may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Figure 11:
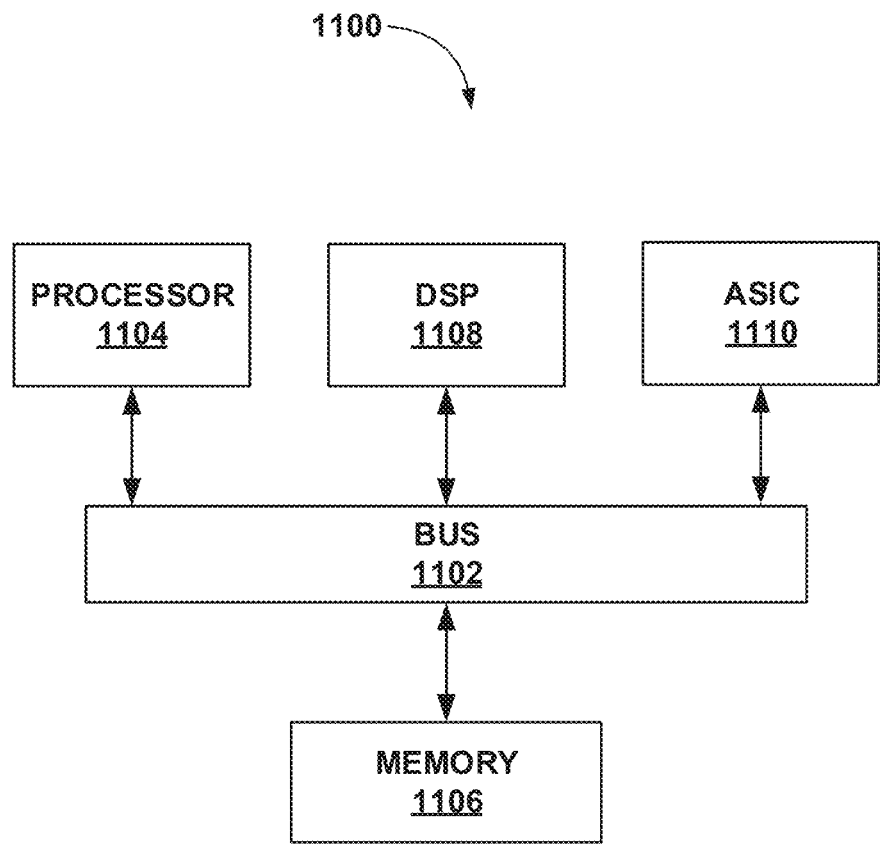
FIG. 11 illustrates an example chip set that can be utilized in implementing features of various embodiments.

FIG. 11 illustrates a chip set 1100 in which embodiments of the disclosure may be implemented. Chip set 1100 can include, for instance, processor and memory components described with respect to FIG. 11 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, chip set 1100 includes a communication mechanism such as a bus 1002 for passing information among the components of the chip set 1100. A processor 1104 has connectivity to bus 1102 to execute instructions and process information stored in a memory 1106. Processor 1104 includes one or more processing cores with each core configured to perform independently. A multi-core processor enables multiprocessing within a single physical package. Examples of a multi-core processor include two, four, eight, or greater numbers of processing cores. Alternatively or in addition, processor 1104 includes one or more microprocessors configured in tandem via bus 1102 to enable independent execution of instructions, pipelining, and multithreading. Processor 1004 may also be accompanied with one or more specialized components to perform certain processing functions and tasks such as one or more digital signal processors (DSP) 1108, and/or one or more application-specific integrated circuits (ASIC) 1110. DSP 1108 can typically be configured to process real-world signals (e.g., sound) in real time independently of processor 1104. Similarly, ASIC 1110 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

Processor 1104 and accompanying components have connectivity to the memory 1106 via bus 1102. Memory 1106 includes both dynamic memory (e.g., RAM) and static memory (e.g., ROM) for storing executable instructions that, when executed by processor 1104, DSP 1108, and/or ASIC 1110, perform the process of example embodiments as described herein. Memory 1106 also stores the data associated with or generated by the execution of the process.

As used herein, the term module might describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the application are implemented in whole or in part using software, in one embodiment, these software elements can be implemented to operate with a computing or processing module capable of carrying out the functionality described with respect thereto. One such example computing module is shown in FIG. 10. Various embodiments are described in terms of this example-computing module 1000. After reading this description, it will become apparent to a person skilled in the relevant art how to implement the application using other computing modules or architectures.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the present application, whether or not such embodiments are described and whether or not such features are presented as being a part of a described embodiment. Thus, the breadth and scope of the present application should not be limited by any of the above-described exemplary embodiments.

Terms and phrases used in the present application, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
   receiving, over a communication channel, a modulated signal at a receiver;
   demodulating the signal at the receiver, the demodulated signal comprising a noise corrupted signal derived from a codeword encoded using standard belief LDPC encoding;
   converting, at the receiver, the noise corrupted signal derived from the standard belief LDPC encoded codeword to a noise corrupted signal derived from a layered belief LDPC encoded codeword; and
   decoding the noise corrupted signal derived from the layered belief LDPC encoded codeword using a layered belief LDPC decoder of the receiver.

2. The method of claim 1, wherein converting the noise corrupted signal comprises receiving a codeword of the form $[i_0, i_1, i_2, \ldots, i_{k-1}, p_0, p_1, p_2, \ldots, p_{n-k-1}]$, where k is a number of information bits, n is a total number of bits, and n-k is a number of parity bits, and changing it to the form $[i_0, i_1, i_2, \ldots, i_{k-1}, p_0, p_W, p_{2W}, \ldots, p_{(M-1)W}, p_1, p_{W+1}, p_{2W+1}, \ldots, p_{n-k-1}]$, where M is a number of parallel computation engines and $W=(n-k)/M$.

3. The method of claim 2, wherein the receiver is a downlink receiver, and wherein the modulated signal is received at the downlink receiver from a satellite transponder.

4. The method of claim 3, wherein the downlink receiver is a receiver of a satellite gateway.

5. The method of claim 2, wherein the demodulated signal comprises a noise corrupted signal derived from a plurality of codewords encoded using standard belief LDPC encoding, the method further comprising:
   converting the noise corrupted signal derived from the plurality of standard belief LDPC encoded codewords to a noise corrupted signal derived from a corresponding plurality of layered belief LDPC encoded codewords; and
   decoding the noise corrupted signal derived from the corresponding plurality of layered belief LDPC encoded codewords using the layered belief LDPC decoder of the receiver.

6. The method of claim 2, further comprising: downconverting the modulated signal received at the receiver.

7. A receiver, comprising:
   a demodulator configured to demodulate a signal received over a communication channel, wherein the demodulated signal comprises a noise corrupted signal derived from a codeword encoded using standard belief LDPC encoding; and
   a decoder configured to:
      convert the noise corrupted signal derived from the standard belief LDPC encoded codeword to a noise corrupted signal derived from a layered belief LDPC encoded codeword; and
      decode the noise corrupted signal derived from the layered belief LDPC encoded codeword using a layered belief LDPC decoder.

8. The receiver of claim 7, wherein converting the noise corrupted signal comprises receiving a codeword the form $[i_0, i_1, i_2, \ldots, i_{k-1}, p_0, p_1, p_2, \ldots, p_{n-k-1}]$, where k is a number of information bits, n is a total number of bits, and n-k is a number of parity bits, and changing it to the form $[i_0, i_1, i_2, \ldots, i_{k-1}, p_0, p_W, p_{2W}, \ldots, p_{(M-1)W}, p_1, p_{W+1}, p_{2W+1}, \ldots, p_{n-k-1}]$, where M is a number of parallel computation engines and $W=(n-k)/M$.

9. The receiver of claim 8, wherein the communication channel is a satellite network communication channel.

10. The receiver of claim 9, wherein the receiver is a receiver of a satellite gateway, and wherein a user satellite terminal encoded the codeword using standard belief LDPC encoding.

11. The receiver of claim 8, wherein the demodulated signal comprises a noise corrupted signal derived from a plurality of codewords encoded using standard belief LDPC encoding, wherein the decoder is configured to:
   convert the noise corrupted signal derived from the plurality of standard belief LDPC encoded codewords to a noise corrupted signal derived from a corresponding plurality of layered belief LDPC encoded codewords; and
   decode the noise corrupted signal derived from the corresponding plurality of layered belief LDPC encoded codewords using the layered belief LDPC decoder.

12. The receiver of claim 8, further comprising: circuitry for downconverting the signal received over the communication channel.

* * * * *